United States Patent [19]

Van Laarhoven

[11] Patent Number: 4,946,550

[45] Date of Patent: Aug. 7, 1990

[54] FORMING ELECTRICAL CONNECTIONS FOR ELECTRONIC DEVICES

[75] Inventor: Josephus M. F. G. Van Laarhoven, Eindhoven, Netherlands

[73] Assignee: U.S. Philips Corporation, New York, N.Y.

[21] Appl. No.: 313,661

[22] Filed: Feb. 21, 1989

[30] Foreign Application Priority Data

Mar. 30, 1988 [GB] United Kingdom ................ 8807579

[51] Int. Cl.[5] ...................... H01L 21/306; B44C 1/22; C03C 15/00; C23F 1/02
[52] U.S. Cl. .................................. 156/643; 156/644; 156/646; 156/648; 156/651; 156/656; 156/657; 156/662; 156/668; 437/62; 437/193; 437/194
[58] Field of Search ................ 156/643, 644, 646, 648, 156/651, 655, 656, 657, 659.1, 662, 663, 668; 204/192.36, 192.37; 252/79.1; 427/38, 39; 430/313, 314, 317, 318; 437/62, 189, 192, 193, 194, 195, 197, 228, 233, 238, 241, 245, 246; 357/49, 59, 71

[56] References Cited

U.S. PATENT DOCUMENTS 4,605,470 8/1986 Gwozdz et al. ................ 156/657 X
4,634,496 1/1987 Mase et al. ............................ 156/643
4,654,113 3/1987 Tuchiya et al. ................. 156/646 X

*Primary Examiner*—William A. Powell
*Attorney, Agent, or Firm*—Paul R. Miller

[57] ABSTRACT

A method is described for providing insulating material on an electrically conductive level (1) of a substructure (10) forming part of an electronic device, which electrically conductive level has at least two spaced-apart electrically conductive regions (1a,1b). Insulating material (2,3) is provided over the electricaly conductive level (1) to a thickness insufficient for insulating material on adjacent conductive regions (1a,1b) to meet thereby leaving a recess (4) in the insulating material between the conductive regions (1a,1b). Next a planarising medium (5) is applied onto the insulating material (2,3) and etched so as to expose a top surface (3a) of the insulating material (2,3) thereby leaving planarising medium (5a) in the recess (4). The insulating material (2,3) is then etched anisotropically using the remaining planarising medium (5a,5b) as a mask so that the surface (11) of the electrically condutive level (1) is exposed. The etching of the insulating material (2,3) is controlled so that the insulating material is etched away just down to the bottom (50a) of the planarising medium (5a) in the recess (4) and the remaining planarising medium (5a,5b) is then removed so as to leave the surface of the substructure (10) between the electrically conductive regions (1a,1b) covered by a relatively flat layer (30) of insulating material. A further layer (6), for example of insulating mateirl, is then deposited onto the remaining relatively flat layer of insulating material.

18 Claims, 3 Drawing Sheets

FORMING ELECTRICAL CONNECTIONS FOR ELECTRONIC DEVICES

This invention relates to electrical connections for electronic devices. In particular, this invention relates to a method of providing insulating material on an electrically conductive level of a substructure forming part of an electronic device, which electrically conductive level has at least two spaced-apart electrically conductive regions.

U.S. Pat. No. 4,634,496 describes such a method in which insulating material is provided over the electrically conductive level to a thickness insufficient for insulating material on adjacent conductive regions to meet thereby leaving a recess in the insulating material between the conductive regions. A planarising medium is then applied onto the insulating material and the planarising medium etched so as to expose a top surface of the insulating material leaving planarising medium in the recess. The insulating material is then etched anisotropically using the remaining planarising medium as a mask so that the surface of the electrically conductive level is exposed.

As described in U.S. Pat. No. 4,634,496, the insulating material is provided over the electrically conductive level as a layer of a first insulating material and then a layer of a second insulating material. The second insulating material layer is then etched anisotropically using the remaining planarising medium as a mask and the first insulating layer as an etch stop so that the etching of the second insulating material layer to expose the top surface of the electrically conductive level removes all of the second insulating material layer except that which is masked by the planarising medium. The portions of the first insulating material layer not masked by the remaining portions of the second insulating material layer are then removed so as to expose the surface of the underlying substructure and the remaining portions of the planarising medium are similarly removed. Thus, a structure is formed in which an insulating material pillar or plug is disposed in the space between two adjacent electrically conductive regions but spaced-apart from the electrically conductive regions. A further insulating material layer is then deposited so as to cover the electrically conductive level and to fill the gaps between the electrically conductive regions and the insulating material plugs.

Although the method described in U.S. Pat. No. 4,634,496 may avoid the probems of the prior art acknowledged in the U.S. Patent, namely the problem of preferential etching of insulating material adjacent corners or edges of the underlying electrically conductive level, the approach adopted is particularly complex and moreover the provision of the insulating plugs or pillars spaced-apart from and between adjacent electrically conductive regions means that the aspect ratio, that is the ratio between the width and depth, of the holes or recesses to be filled by the further insulating material layer is made worse, as the depth of the holes or recesses to be filled is increased relative to their width and accordingly the coverage of the further insulating material layer may be adversely affected.

According to the present invention, there is provided a method of providing insulating material on an electrically conductive level of a substructure forming part of an electronic device, which electrically conductive level has at least two spaced-apart electrically conductive regions, which method comprises providing insulating material over the electrically conductive level to a thickness insufficient for insulating material on adjacent conductive regions to meet thereby leaving a recess in the insulating material between the conductive regions, applying a planarising medium onto the insulating material, etching the planarising medium so as to expose a top surface of the insulating material thereby leaving planarising medium in the recess, etching the insulating material anisotropically using the remaining planarising medium as a mask so that the surface of the electrically conductive level is exposed, characterised by controlling the etching of the insulating material so that the insulating material is etched away just down to the bottom of the planarising medium in the recess and then removing the remaining planarising medium thereby leaving the surface of the substructure between the electrically conductive regions covered by a relatively flat layer of insulating material and depositing a further layer onto the remaining relatively flat layer of the insulating material.

Thus, using a method embodying the invention, good coverage by the further layer, for example a further insulating layer, may be facilitated in a relatively simple manner. Furthermore, controlling the etching of the insulating material so that the insulating material is etched away just down to the bottom of the planarising medium in the recess to leave, after removal of the remaining planarising medium, the surface of the substructure between the electrically conductive regions covered by a relatively flat layer of insulating material results in the remaining recess or step in the surface having a better, rather than a worse, aspect ratio, that is the depth of the recess has been decreased relative to its width, and therefore subsequent coverage by the further layer should be improved.

In a preferred embodiment, a method in accordance with the invention comprises providing the insulating material over the electrically conductive level as a layer of a first insulating material and then a layer of a second insulating material, etching the second insulating material layer anisotropically using the remaining planarising medium as a mask and the first insulating material layer as an etch stop so that the surface of the electrically conductive level is exposed, controlling the etching of the second insulating material layer so that the second insulating material is etched away just down to the bottom of the planarising medium in the recess thereby leaving the surface of the substructure between the electrically conductive regions covered by the first insulating material layer and by a relatively flat layer of the second insulating material after removal of the remaining planarising medium. In such an arrangement, the etching of the second insulating material layer may be controlled by predetermining the relative thicknesses of the first and second insulating material layers and selecting the anisotropic etching process so that the predetermined thickness of the first insulating material layer is etched away in the same time in which a thickness of the second insulating material layer equal to, or possibly just slightly less than, the thickness of the electrically conductive level minus the thickness of the second insulating material layer is etched away so as to provide the relatively flat surface to the second insulating material remaining between the electrically conductive regions after removal of the remaining photosensitive resist.

A plasma etching process may be used to etch the planarising medium to expose the top surface of the second insulating material layer and then the constituents of the plasma altered so as to etch the second insulating material layer using the remaining portions of the planarising medium as a mask. Thus, the two selective etching steps can be carried out as part of a continuous etching process merely by altering the constituents of the plasma further simplify the process. A photosensitive resist may be used as the planarising medium. In such circumstances, the plasma used to etch the planarising medium may be a fluorine-containing plasma to which initially oxygen is added. Using such a plasma, once the top surface of the second insulating material layer has been exposed, the supply of oxygen is stopped so that the second insulating material layer is then etched in preference to the photosensitive resist and the remaining portions of the photosensitive resist act as a mask. Such a process is particularly simple to operate and takes advantage of the fact that the detection of the end point of the etching of the photosensitive resist is not that critical, it merely being necessary to ensure that sufficient photosensitive resist remains in the recess to mask the underlying portion of the second insulating material layer.

The further layer may comprise a final insulating material layer of the electronic device or may be an insulating layer used to provide isolation between the electrically conductive level and subsequent electrically conductive levels. In the latter case the further insulating material layer may subsequently be etched to expose the surface of the selectively conductive level and conductive material deposited so as to form a further electrically conductive level interconnecting with the electrically conductive level. Alternatively, using conventional photolithographic and etching techniques, a via may be defined through the further insulating material layer to expose a surface of at least one of the electrically conductive regions and conductive material deposited to form a further electrically conductive level interconnecting with at least one conductive region of the electrically conductive level.

The electrically conductive level may be an aluminium-containing electrically conductive level. Alternatively, the electrically conductive level may be a doped polycrystalline silicon level, for example the electrically conductive level of an insulated gate structure.

Embodiments of the invention will now be described, by way of example, with reference to the accompanying drawings, in which.

Figure 1:
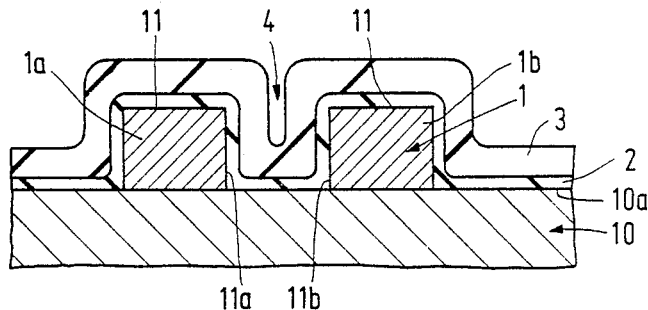
FIGS. 1, 2, 3, 4, 5 and 6 are cross-sectional views of part of a substructure forming part of an electronic device and illustrate sequentially various stages in a method embodying the invention.

It should be noted that the Figures are diagrammatic and not drawn to scale. The relative dimensions and proportions of parts of the Figures (particularly in the direction of thickness) have been shown exaggerated or diminished for the sake of clarity and convenience in the drawings. The same (or related) reference signs as used in one embodiment are generally used for referring to corresponding or similar parts in other embodiments.

Referring now to the drawings, FIGS. 1 to 9 illustrate methods embodying the invention of providing insulating material on an electrically conductive level 1 of a substructure 10 forming part of an electronic device which electrically conductive level 1 has at least two spaced-apart electrically conductive regions 1a, 1b. The method comprises providing insulating material 2, 3 over the electrically conductive level 1 to a thickness insufficient for insulating material provided on adjacent conductive regions 1a, 1b to meet thereby leaving a recess 4 in the insulating material between the conductive regions 1a, 1b, applying a planarising medium 5 onto the insulating material 2, 3, etching the planarising medium 5 so as to expose a top surface 3a of the insulating material 3 thereby leaving planarising medium 5a, 5b in the recess 4 and etching the insulating material 2, 3 anisotropically using the remaining planarising medium 5a, 5b as a mask to expose the surface 11 of the electrically conductive level. In accordance with the invention, the etching of the insulating material 2, 3 is controlled so that the insulating material is etched away just down to the bottom 50a of the planarising medium 5a in the recess 4 and then the remaining planarising medium 5a, 5b is removed thereby leaving the surface of the substructure between the electrically conductive regions covered by a relatively flat layer 30 of insulating material. A further layer 6 of, for example, insulating material is then deposited onto the remaining relatively flat layer 30 of insulating material.

A method embodying the invention will now be described in greater detail with reference to FIGS. 1 to 6 of the drawings.

Referring first to FIG. 1, the electrically conductive level 1 is deposited onto the substructure 10 using conventional techniques and patterned so as to define electrically conductive regions of which two, 1a, 1b, are shown. The electrically conductive level 1 may be formed of an aluminium-containing electrically conductive material deposited using a conventional technique such as sputter deposition or chemical vapour deposition, and may be provided on the substructure 10 so as to connect electrically, although not shown in FIGS. 1 to 6, to an underlying part of the substructure 10, which part may be, for example, a lower metallisation level. As an example of one possible other alternative, the electrically conductive level 1 may comprise the electrically conductive layer of an insulated gate structure and may be formed of doped polycrystalline silicon, for example. In such a case, although not shown in FIGS. 1 to 6, the substructure 10 will of course have an insulating gate oxide layer adjacent the surface 10a of the substructure 10. The polycrystalline silicon may be deposited, doped and defined using conventional techniques.

The dimensions of the electrically conductive level 1 will of course depend on the particular electronic device and the function of the electrically conductive level 1. However, to take an example, the electrically conductive regions 1a, 1b of the electrically conductive level 1 may be stripes of uniform cross-section with a thickness equal to their width and separated by a distance similarly equal to their width, for example the electrically conductive level 1 may have a thickness of 1 micrometer and may be formed of electrically conductive regions in the form of stripes having a width of 1 micrometer and a spacing or separation of 1 micrometer.

After the electrically conductive level 1 has been patterned and defined, the first insulating material layer is deposited. In this example, the first insulating material layer is a layer of silicon nitride deposited using a conventional plasma enhanced chemical vapour deposition technique. For an electrically conductive level 1 having the dimensions given above, the silicon nitride layer 2 may have a thickness of approximately 0.1 to 0.2 micrometers.

After deposition of the plasma silicon nitride layer 2, the second insulating material layer 3, in this example a layer of plasma silicon dioxide, is deposited to a thickness which is insufficient for insulating material deposited on side wall 11a, 11b of the electrically conductive regions 1a and 1b to meet so that the recess 4 is defined in the second insulating material layer between the two spaced-apart electrically conductive regions 1a, 1b. For the dimensions given above, the second insulating material layer may have a thickness sufficient to provide an overall insulating layer thickness, that is including both the first and second insulating material layers 2 and 3, of about 0.4 micrometers so that the recess 4 has a width of about 0.2 micrometers and a depth of about 1 micrometer. Of course, the electrically conductive regions 1a, 1b may be spaced-apart by a distance greater than 1 micrometer in which case, the insulating layer 3 may be thicker, with the precise dimensions of the first and second insulating material layers 2 and 3 being selected so that the recess 4 has a width of at least about 0.2 micrometers.

Figure 2:
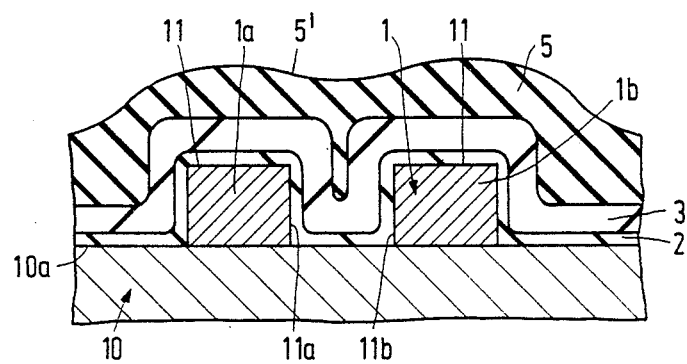

Next, as indicated in FIG. 2, the planarising medium 5 is applied to cover the second insulating material layer 3. In this example, the planarising medium comprises a conventional photosensitive resist, for example a positive photosensitive resist such as HPR204 produced by the Hunt Company, although any other suitable photosensitive resist may be used. As an alternative to the use of a photosensitive resist it may be possible to use other planarising media, that is other materials which when applied, usually spun onto, a surface are relatively flowable so that they fill cracks and crevices and provide a relatively planar surface and which can then be set, if necessary, to provide a relatively flat surface. Thus, for example, materials such as polyimide or a spin-on-glass may be used. However, where, as will be appreciated from the following, the planarising medium is being used as a sacrificial planarising layer, then the use of a photosensitive resist is preferred for reasons of economy and availability and because of the relative ease with which photosensitive resist may be removed when desired.

When the photosensitive resist planarising medium has been spun onto the surface of the second insulating material layer 3, the resist is subjected to a uniform or flood ultraviolet exposure as is conventional in the art and is subsequently baked at 200 degrees Celsius so as to provide the planarising medium 5 with a relatively flat surface 5'.

Figure 3:
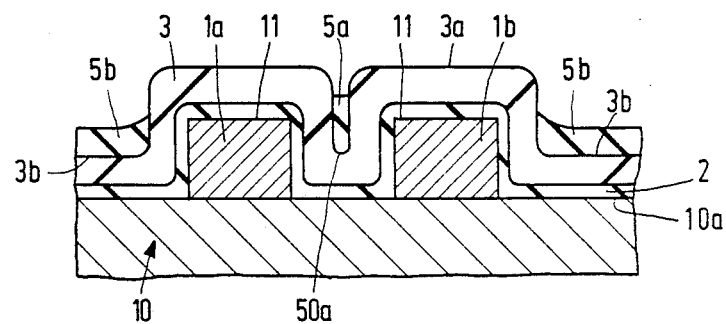
Figure 4:
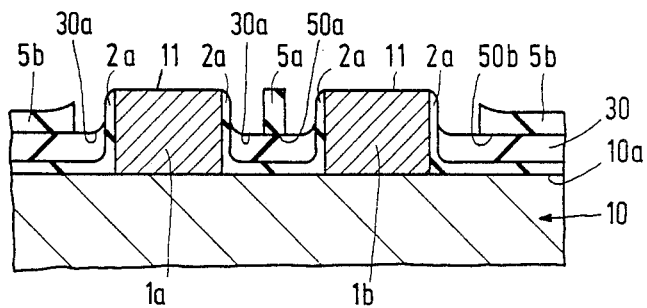

Next, the planarising medium 5 is etched to expose the top surface 3a of the second insulating material layer 3 while leaving, as shown in FIG. 3, portions of the planarising medium on lower surfaces of the second insulating material layer 3, that is within recesses and crevices of the second insulating material layer 3 and on surfaces 3b of the second insulating material layer which extend over the surface 10a of the substructure 10 and not over the electrically conductive regions 1a, 1b. Thus, as shown in FIG. 3, a portion 5a of the planarising medium remains to fill the recess 4 defined in the second insulating material layer 3 between the electrically conductive regions 1a, 1b and portions 5b of the planarising medium remain overlying the lower surface areas 3b of the second insulating material layer 3 which do not lie over electrically conductive regions of the electrically conductive level 1.

In this example, the photosensitive resist planarising medium is anisotropically etched using a plasma etching technique, although other anisotropic etching techniques can be used, for example a reactive ion or magnetron etching technique could be used. Thus, the photosensitive resist planarising medium 5 is etched in a fluorine-containing plasma with argon as the carrier gas and to which oxygen has been added. The fluorine-containing plasma may be, for example $CF_4$ or $CHF_3$ although the plasma used may be any suitable fluorocarbon plasma or, for example, another fluorine containing plasma such as an $S_xF_y$ (for example $SF_6$) or an $NF_3$ plasma. The amount of oxygen added to the plasma will determine the relative etch rates for the photosensitive resist and the silicon dioxide and is preferably selected so that the photosensitive resist is etched more quickly than the silicon dioxide, although the amount of oxygen added could be selected so that the photosensitive resist and the silicon dioxide are etched at the same, or roughly the same, rate. The plasma etching process is continued until the top surface 3a of the second insulating material layer 3 is exposed, this end point being detected by examining the spectrum of the constituents in the plasma, for example as is conventional, monitoring the carbon monoxide emission line (483 nm) of the spectrum.

Next, the second insulating material layer 3, in this example the plasma silicon dioxide layer, is selectively and anisotropically etched using the remaining portions 5a, 5b of the photosensitive resist planarising medium 5 as a mask and using the plasma silicon nitride layer 2 as an etch stop layer, so as to expose the top surface 1 of the electrically conductive level 1. In this example, the selective etching of the second insulating material layer 3 is carried out by a plasma etching process, for example using carbon tetrafluoride or $CHF_3$ with argon as the carrier gas. Thus, the same fluorine-containing plasma may be used to etch both the photosensitive resist planarising medium 5 and the plasma silicon dioxide layer 3, the difference being that oxygen is added to the constituents of the plasma to enable selective etching of the photosensitive resist planarising medium 5 and is removed to enable selective etching of the plasma silicon dioxide layer 3. Thus, the selective etching of the photosensitive resist planarising medium and the subsequent etching of the plasma silicon dioxide layer may be carried out in a continuous etching process with the supply of the oxygen to the plasma etching chamber being terminated when the top surface 3a of the second insulating material layer 3 is exposed (as detected by the carbon monoxide emission line of the plasma spectrum) so as to commence the selective etching of the plasma silicon dioxide layer. Because the precise detection of the end point of the selective etching of the planarising medium is not particularly critical, it merely being necessary to ensure that the portion 5a of the planarising medium remains to mask the underlying portion of the second insulating material layer 3, a slight over-etching of the planarising medium 5 may be tolerated although care should be taken so as not to remove the photosensitive resist 5b.

The anisotropic etching of the second insulating material layer 3, in this example the silicon dioxide layer, is continued until the top surface of the electrically conductive level 1 is exposed. The characteristics and thicknesses of the first and second insulating material layers 2 and 3 and the etching process used to etch the insulating material are selected so that the etching of the insulating material has just reached the bottom 50a, 50b of the remaining portions of the planarising medium 5 when the surface 11 of the electrically conductive level 1 is exposed. Thus, the first insulating material, in this example silicon nitride, is removed from the top surface 11 of the electrically conductive level 1, and side walls 2a of the first insulating material layer 2 are exposed. However, a layer 30 of the second insulating material layer 3 remains which has a relatively flat surface 30a both within the space between adjacent electrically conductive regions 1a, 1b and at edges of the electrically conductive level 1 where the insulating material lies directly over the substructure 10. The anisotropic etching does not need to be controlled so as to stop precisely at the level of the bottom 50a, 50b of the remaining portions of the planarising medium but may stop slighly above or slightly below the bottom 50a, 50b leaving a small step in the relatively flat surface 30a beneath the remaining planarising medium.

The remaining portions 5a, 5b of the planarising medium, in this example the photosensitive resist, are then removed using an appropriate conventional technique. Thus, for example in the case of a photosensitive resist, a wet etching step using, for example, acetone or smoking HNO$_3$ or an appropriate dry etching step may be used.

Figure 5:
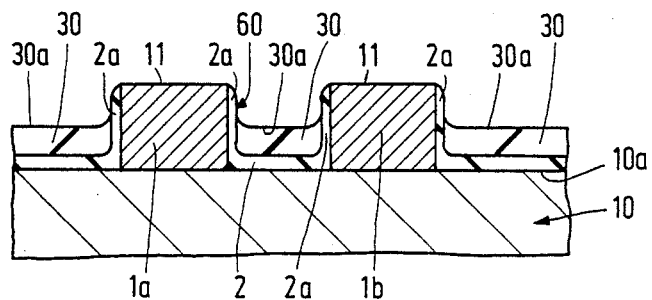
Figure 6:
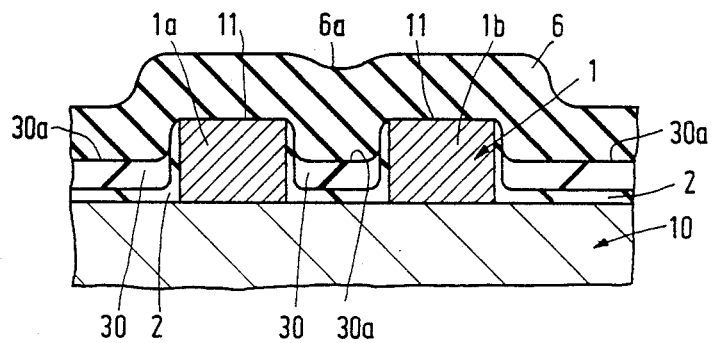

FIG. 5 illustrates the structure after the removal of the remaining portions 5a, 5b of the planarising medium. As can be seen from FIG. 5, the fact that the selective etching of the second insulating material layer 3 leaves a remaining layer 30 of the second insulating material which has a relatively flat surface 30a means that steps or recesses in the free surface of the structure are much reduced. Thus, for example, after removal of the remaining portions 5a, 5b of the planarising medium, the remaining layer 30 of the second insulating material layer serves to fill partially the space between adjacent electrically conductive regions 1a, 1b so that, although there is a recess 60 in the surface between adjacent electrically conductive regions 1a, 1b, the aspect ratio of the recess 60 is much reduced compared to that of the recess 4, that is the depth of the recess 60 is less than the depth of the original recess 4 while the width of the recess 60 is slightly greater than that of the original recess 4. Moreover, the selective etching of the second insulating material layer 3 leaves a relatively flat surface 30a to the remaining layer 30 of the second insulating material. In addition, the slight etching of side wall portions 2a of the first insulating material layer serves to provide a more smooth contour to the surface at the corners of the electrically conductive regions 1a, 1b which should facilitate coverage of subsequent material.

In the example described above, the first and second insulating material layers 2 and 3 are formed of silicon nitride and silicon dioxide, respectively. However, any suitable two different insulating materials can be used to form the first and second layers 2 and 3 provided that an etching technique is available which will allow the etching of the second insulating material layer 3 to be controlled as described above, so that the second insulating material layer is etched just down to the bottom 50a, 50b of the remaining portions 5a, 5b of the planarising medium when the conductive surface 11 is exposed. Thus, for example, one of the first and second layers may be a polyimide or silicon oxynitride layer while the other may be a silicon nitride or silicon dioxide layer. Also, the first layer 2 could be a silicon dioxide layer and the second layer 3 a silicon nitride layer. Although, in the arrangement described above, first and second different insulating material layers are provided, and the first insulating material layer 2 is used as an etch stop, where the exposure of the electrically conductive surface 11 to the plasma is not a problem, for example where the electrically conductive surface 11 is not an aluminium-containing surface 11 which could catalytically enhance undesired polymer formation during the etching, then the first insulating material layer 2 may be omitted and the exposure of the electrically conductive surface 11 could then be used to detect the desired end part of the etching of the insulating material.

The use of a method embodying the invention provides a relatively more flat surface onto which a further layer, in this example a further layer 6 of silicon dioxide deposited using a plasma enhanced chemical vapour deposition technique, can be provided which is substantially free of voids and moreover provides a relatively planar or more flat surface 6a. The further layer need not necessarily be an insulating layer as, for example, metallisation could be deposited as the further layer so as to connect electrically the electrically conductive regions 1a and 1b.

Where the electrically conductive level 1 is the final electrically conductive level of the electronic device, then the further insulating layer 6 may be a final passivating layer which, by using a method in accordance with the invention, has been made more flat so facilitating a reduction in the stresses and strains which may occur during encapsulation where there are significant steps in the final surface of an electronic device.

Figure 7:
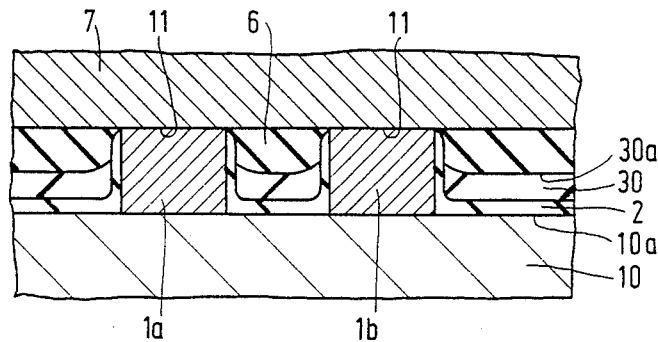
FIG. 7 is a cross-sectional view similar to FIGS. 1 to 6 illustrating a further stage of a method embodying the invention.
Figure 8:
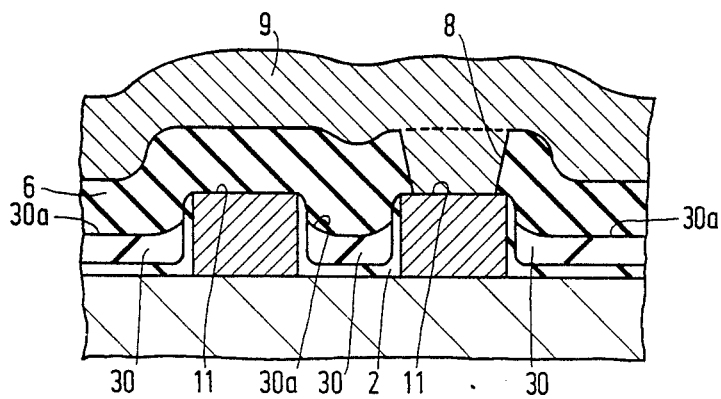
FIG. 8 is a cross-sectional view similar to FIGS. 1 to 6 illustrating an alternative further stage of a method embodying the invention.

The electrically conductive level 1 need not necessarily be the final metallisation level of the electronic device and, as indicated by FIGS. 7 and 8, further metallisation may be deposited and interconnected to the first metallisation level.

FIG. 7 illustrates schematically one way in which a further metallisation level 7 may be provided. Thus, in the arrangement shown in FIG. 7, the further insulating material layer 6 is etched back uniformly to expose the surface 11 of the electrically conductive level 1 and then further metallisation, for example aluminium, deposited and patterned using conventional deposition and photolithographic techniques to provide a further metallisation level 7 interconnecting electrically conductive regions 1a, 1b of the electrically conductive level 1. To ensure an even more flat or planar surface, a sacrificial planarising medium, for example a photoresist, may be spun onto the further insulating material layer 6 prior to etching back of the further insulating material layer and then the planarising medium and the further insulating material layer 6 etched uniformly using an appropriate plasma etching technique.

Alternatively as illustrated in FIG. 8, where it is desired, for example, to contact only one of the electrically conductive regions 1a, 1b, then a via 8 may be opened through the further insulating material layer 6 using conventional photolithographic and etching techniques and then further metallisation 9, for example aluminium, deposited and patterned to enable connection of the electrically conductive region 1b to the further metallisation level 9.

Figure 9:
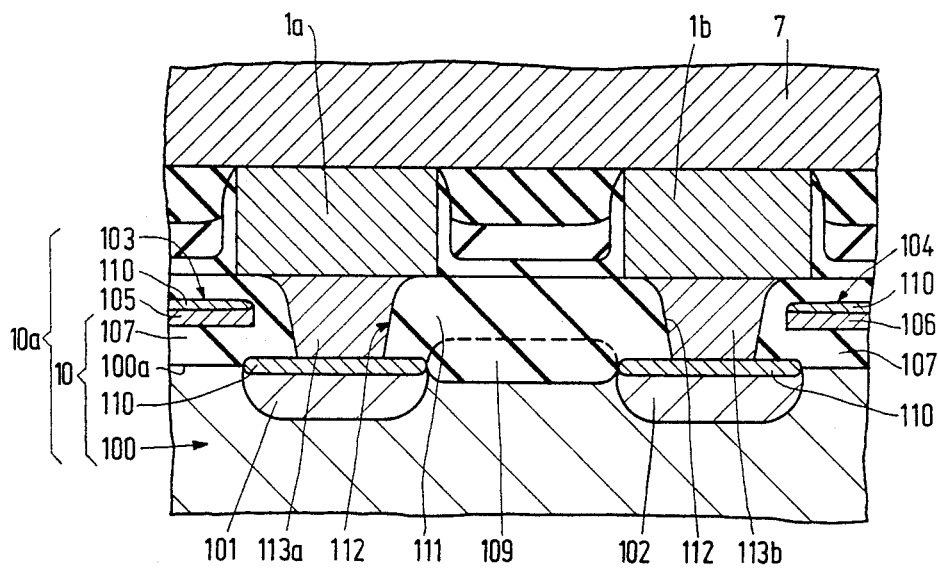
FIG. 9 is a cross-sectional view of part of an electronic device manufactured using a method embodying the invention.

FIG. 9 is a schematic cross-sectional view illustrating part of a monocrystalline semiconductor body 100 of an electronic device, for example an integrated circuit such as a CMOS integrated circuit, in which a method embodying the invention is used.

As shown in FIG. 9, the semiconductor body 100 has two doped regions 101 and 102 adjacent a surface 100a of the body 100. The semiconductor body 100 will of course incorporate many such doped regions. The particular regions 101 and 102 shown in FIG. 9 form either source or drain regions of adjacent insulated gate field effect transistors (MOST) which may be of opposite channel type. A respective insulated gate 103 and 104 is provided for each MOST by a doped polycrystalline silicon conductive gate 105 and 106 deposited onto a thin silicon dioxide gate layer 107. Field oxide 109 (indicated in part by dashed line in FIG. 9) formed by local oxidation of silicon (LOCOS) in a known manner separates the insulated gate field effect transistors.

In order to provide lower contact resistance to subsequent metallisation, titanium is sputter-deposited over the surface 100a and the body 100 is then heated rapidly to form a titanium silicide contact layer 110 at the exposed silicon surface areas, that is on the doped regions 101 and 102 and on the polycrystalline silicon gates 105, 106. The remaining titanium on the insulating material may be removed by etching in a solution of, for example, hydrogen peroxide and ammonium hydroxide in water.

An insulating layer 111 is then deposited by chemical vapour deposition and, using conventional photolithographic and etching techniques, vias 112 are opened through the insulating layer 111. Conductive plugs 113a and 113b may then be formed in each via by first depositing an adhesion layer of, for example, titanium or titanium-tungsten and then depositing tungsten, for example by chemical vapour deposition, after etch-back of the deposited material, to form the conductive plugs 113a and 113b in the vias 112. The metallisation level 1 may then be deposited and defined so that the electrically conductive regions 1a and 1b electrically connect to respective conductive plugs 113a and 113b. Alternatively, where metal deposition into the vias is not a problem, the tungsten plugs may be omitted and the further metallisation, usually aluminium, directly deposited so as to fill the vias and also form the metallisation level 1. The substructure up to the top of the insulating layer thus forms the substructure 10 of the arrangement shown in FIGS. 1 to 6 and the method illustrated in FIGS. 1 to 6 and described above may then be carried out as shown in FIG. 9 to provide insulating material on the electrically conductive level 1 and further metallisation 7 provided as described above with reference to FIG. 7 to enable contact to the metallisation level 1.

Where the substructure 10 carries an array or matrix of semiconductor elements, such as MOS transistors, then (although not shown) the electrically conductive level 7 may be patterned so as to provide electrically conductive strips arranged to extend parallel to one another and spaced-apart in a direction perpendicular to the direction in which the cross-section of FIG. 9 is taken (that is perpendicular to the plane of the paper) so that desired semiconductor elements are interconnected. In such a case, the structure shown in FIG. 9 up to the top of the electrically conductive regions 1a and 1b may form the substructure 10a and the method described above with reference to FIGS. 1 to 6 may then be used to provide a final insulating layer for the semiconductor device.

A method embodying the invention may be used to provide electrical connection to a substructure forming part of a semiconductor device which may be, as described above, an integrated circuit semiconductor device or which may be a discrete semiconductor device, even a power semiconductor device. A method embodying the invention may also have applications in other electronic device fields, for example in the fields with liquid crystal displays and magnetic bubble memories.

From reading the present disclosure, other modifications will be apparent to persons skilled in the semiconductor art for example persons skilled in the design, manufacture and/or use of semiconductor devices. Although claims have been formulated in this application to particular combinations of features, it should be understood that the scope of the disclosure of the present application also includes any novel feature or novel combination of features disclosed herein either explicitly or implicitly or any generalisation or modification of that feature or of one or more of those features whether or not it relates to the same invention as presently claimed in any claim. The applicants hereby give notice that new claims to such features and/or combinations of such features may be formulated during the prosecution of the present application or of any further application derived therefrom.

I claim:

1. A method of providing insulating material on an electrically conductive level of a substructure forming part of an electronic device, which electrically conductive level has at least two spaced-apart electrically conductive regions, which method comprises providing insulating material over the electrically conductive level to a thickness insufficient for insulating material on adjacent conductive regions to meet, thereby leaving a recess in the insulating material between the conductive regions, applying a planarising medium onto the insulating material, etching the planarising medium so as to expose a top surface of the insulating material, thereby leaving planarising medium in the recess, etching the insulating material anisotropically using the remaining planarising medium as a mask so that the surface of the electrically conductive level is exposed, characterised by controlling the etching of the insulating material so that the insulating material is etched away just down to the bottom of the planarising medium in the recess, and then removing the remaining planarising medium, thereby leaving the surface of the substructure between the electrically conductive regions covered by a relatively flat layer of insulating material, and depositing a further layer onto the remaining relatively flat layer of the insulating material.

2. A method according to claim 1, which comprises providing the insulating material over the electrically conductive level as a layer of a first insulating material and then a layer of a second insulating material, etching the second insulating material layer anisotropically using the remaining planarising medium as a mask and the first insulating material layer as an etch stop so that the surface of the electrically conductive level is exposed, controlling the etching of the insulating material so that the insulating material is etched away just down to the bottom of the planarising medium in the recess, thereby leaving the surface of the substructure between the electrically conductive regions covered by a relatively flat layer insulating material after removal of the remaining planarising medium.

3. A method according to claim 2, which comprises using silicon nitride as the first insulating material and silicon dioxide as the second insulating material.

4. A method according to claim 1, which comprises using a photosensitive resist as the planarising medium.

5. A method according to claims 1 or 3, which comprises using a plasma etching process to etch the planarising medium to expose the top surface of the insulating material and then altering the constituents of the plasma so as to etch the insulating material using the remaining portions of the planarising medium as a mask.

6. A method according to claims 1, 2 or 3, which comprises depositing the further layer as a layer of insulating material onto the remaining relatively flat layer of the second insulating material.

7. A method according to claim 6, which further comprises etching the further insulating material layer to expose the surface of the electrically conductive level and depositing conductive material so as to form a further electrically conductive level interconnecting with the electrically conductive level.

8. A method according to claim 6, which further comprises defining a via through the further insulating material layer to expose a surface of at least one of the electrically conductive regions and depositing conductive material to form a further electrically conductive level interconnecting with at least one conductive region of the electrically conductive level.

9. A method according to claims 1, 2 or 3, which comprises using an aluminium-containing electrically conductive level for at least one electrically conductive level.

10. A method according to claims 1, 2 or 3, which comprises using doped polycrystalline silicon for the electrically conductive level.

11. A method according to claim 8, which comprises using doped polycrystalline silicon for the electrically conductive level.

12. A method according to claim 4, which comprises using a plasma etching process to etch the planarising medium to expose the top surface of the insulating material and then altering the constituents of the plasma so as to etch the insulating material using the remaining portions of the planarising medium as a mask.

13. A method according to claim 5, which comprises depositing the further layer as a layer of insulating material onto the remaining relatively flat layer of the second insulating material.

14. A method according to claim 13, which further comprises etching the further insulating material layer to expose the surface of the electrically conductive level and depositing conductive material so as to form a further electrically conductive level interconnecting with the electrically conductive level.

15. A method according to claim 13, which further comprises defining a via through the further insulating material layer to expose a surface of at least one of the electrically conductive regions and depositing conductive material to form a further electrically conductive level interconnecting with at least one conductive region of the electrically conductive level.

16. A method according to claim 7, which comprises using an aluminum-containing electrically conductive level for at least one electrically conductive level.

17. A method according to claim 8, which comprises using an aluminum-containing electrically conductive level for at least one electrically conductive level.

18. A method according to claim 7, which comprises using doped polycrystalline silicon for the electrically conductive level.

* * * * *